United States Patent [19]

Crane et al.

[11] 3,838,984

[45] Oct. 1, 1974

[54] FLEXIBLE CARRIER AND INTERCONNECT FOR UNCASED IC CHIPS

[75] Inventors: John R. Crane, St. Paul; James C. Lawson, Minnetonka; Richard J. Petschauer, Minneapolis, all of Minn.

[73] Assignee: Sperry Rand Corporation, New York, N.Y.

[22] Filed: Apr. 16, 1973

[21] Appl. No.: 351,224

[52] U.S. Cl......... 29/193.5, 174/52 PE, 174/DIG. 3, 29/470

[51] Int. Cl............................................ B21c 37/83

[58] Field of Search................ 174/DIG. 3; 317/101; 29/193, 54

[56] References Cited

UNITED STATES PATENTS

| | | | |
|---|---|---|---|
| 3,184,831 | 5/1965 | Siebertz | 174/DIG. 3 |
| 3,390,308 | 6/1968 | Marley | 174/DIG. 3 |
| 3,541,222 | 11/1970 | Parks et al. | 317/101 CM |

*Primary Examiner*—Helen M. McCarthy
*Assistant Examiner*—O. F. Crutchfield
*Attorney, Agent, or Firm*—Kenneth T. Grace; Thomas J. Nikolai; John P. Dority

[57] ABSTRACT

A printed circuit lead frame that functions as a carrier of an integrated circuit (IC) uncased chip for initial handling and testing and later as a means for bonding the chip's contacts to printed circuitry on a supporting substrate is disclosed. The lead frame includes a flexible insulating sheet member having a plurality of inner via holes arranged in a pattern to match that of the terminal contacts on the associated chip and a plurality of outer via holes arranged in a pattern to match that of the terminal pads on the supporting substrate member. Gold bumps in each of the inner and outer via holes extend beyond the bottom surface of the sheet member to make a conductively bonded contact with the associated terminal contacts on the associated chip and the associated terminal pads on the supporting substrate member while printed circuit leads affixed to the top surface of the sheet member conductively intercouple associated pairs of inner and outer gold bumps to complete the electrical coupling of the associated chip to the supporting substrate member.

6 Claims, 8 Drawing Figures

FLEXIBLE CARRIER AND INTERCONNECT FOR UNCASED IC CHIPS

BACKGROUND OF THE INVENTION

In the Hugle U.S. Pat. No. 3,440,027 there is provided a prior art method of manufacturing a semiconductor package. Hugle's method involves forming from a roll of a copper-coated flexible insulative strip an array of patterns of copper beam leads using well-known printed circuitry techniques. The beam leads terminate in contact points that mate with the terminal contacts on one surface of an uncased IC chip that is to be bonded thereto. The bonded chip and beam leads are subsequently separated from the strip and the chip is encased in a suitable top or cover with the beam leads extending therefrom for electrical coupling to the now encased IC chip.

This prior art method requires that the pattern of copper beam leads be gold plated and then selectively etched leaving a gold "bump" on the beam lead's contact points which gold bumps are through an ultrasonic wire bonding technique---see the publication "Surveying Chip Interconnection Techniques," H. K. Dicken, Electronic Packaging and Production, October 1970, pages 34 - 45---bonded to a solder "bump" on each of the chip's terminal contacts---see the C. Nelson, et al., U.S. Pat. No. 3,625,837. Because the beam leads on the flexible insulative strips are vis-a-vis, i.e., not separated by an insulative sheet member, the conductive elements on the surface of the uncased IC chip, elaborate precautions must be taken to preclude contact there-between. The present invention is intended to obviate this source of chip failure while further eliminating the need for reworking the as-purchased uncased IC chips such as providing solder or gold bumps on each of the chip's terminal contacts prior to the bonding to the beam leads. Additionally eliminated is the use of beam leads that unsupportively overhang the chip case using instead leads that are supported by the supporting flexible insulative sheet member.

SUMMARY OF THE INVENTION

In the present invention there is provided a method of manufacturing a semiconductor package which functions as an edge mounted printed circuit board----see the publication "Leadless, Pluggable IC Packages Reduce Fabrication and Repair Costs," S. E. Grossman, Electronics, Feb. 1, 1973, pages 83 - 89. The method is initiated by forming a carrier of an uncased IC chip from a flexible insulative sheet member supporting a copper layer. A plurality of copper lead frame patterns are formed in the copper layer; each lead frame pattern consists of a plurality of separate copper leads having inner and outer end terminals that match the pattern of the terminal contacts on the associated chip and the pattern of the terminal pads on the supporting substrate member, respectively. Inner and outer via holes are etched into the insulative sheet member from the bottom side of the insulative sheet member through to the inner and outer end terminals, respectively, of the copper leads on the top surface of the insulative sheet member. Gold bumps are then formed in each of the inner and outer via holes to extend beyond the bottom surface of the insulative sheet member. The copper leads are then gold plated to prevent oxidation and corrosion and the insulative sheet member is selectively etched in the area of the copper leads to relieve stress of the inner bond contacts during outer bonding. The aluminum metallization terminal contacts of the associated uncased IC chip are then thermocompressively or ultrasonically bonded to the inner gold bumps of the lead frame for securing the uncased IC chip to the flex frame carrier that is formed by the flexible insulative sheet member that supports the plurality of lead frames.

After attaching the flex frame carrier to the uncased IC chips the flex frame bonded chips are functionally tested, using special copper leads for electrical access to the integrated circuitry on the chip, before attaching the chip to the thick film hybrid substrate member.

After functionally testing the individual uncased IC chips the acceptable chips and their associated lead frames are separated from the flex frame carrier. The outer gold bumps of the lead frame, which includes the supporting flexible insulative sheet member, are then thermocompressively wobble bonded to the terminal pads on the supporting thick film substrate member, after attaching the integrated circuit using conductive epoxy directly upon the thick film substrate member. A suitable cover is then hermetically bonded to the substrate member to encase the hybrid circuit which has multiple flex frame bonded chips bonded on the supporting substrate member.

DESCRIPTION OF THE PREFERRED EMBODIMENT

Figure 1:
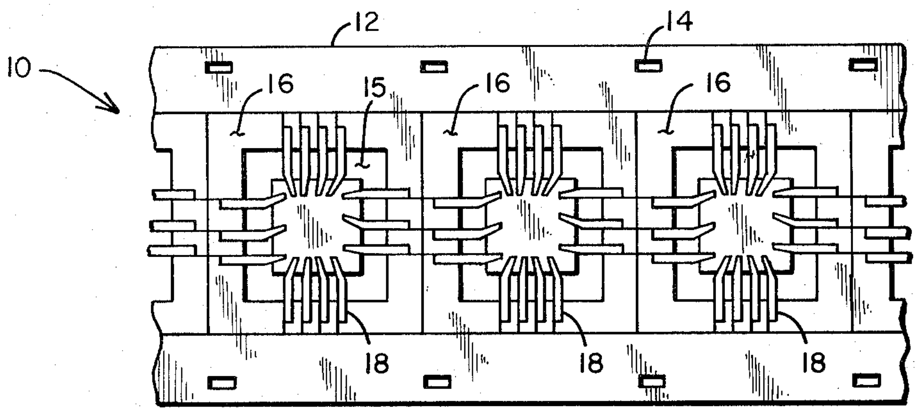
FIG. 1 is a plan view of a carrier strip of the present invention.

With particular reference to FIG. 1 there is presented a plan view of the carrier strip 10 of the present invention. Carrier strip 10 consists of an elongated flexible insulative sheet member 12 having a plurality of sprocket holes 14 along the outer edges thereof for the automatic indexing of the continuous series of lead frames 16 having a copper lead frame pattern formed thereon. Each lead frame pattern consists of a plurality of separate copper leads 18 having patterns of inner and outer end terminals that match the pattern of the terminal contacts 21 on the associated uncased IC chip 20 and the pattern of the terminal pads 38 on the supporting thick film hybrid substrate member 32, respectively see FIG. 3. Also provided in each lead frame 16 is a stress relief 15 to relieve stress upon the inner end terminals during bonding of the outer end terminals to the thick film hybrid substrate member.

Figure 2:
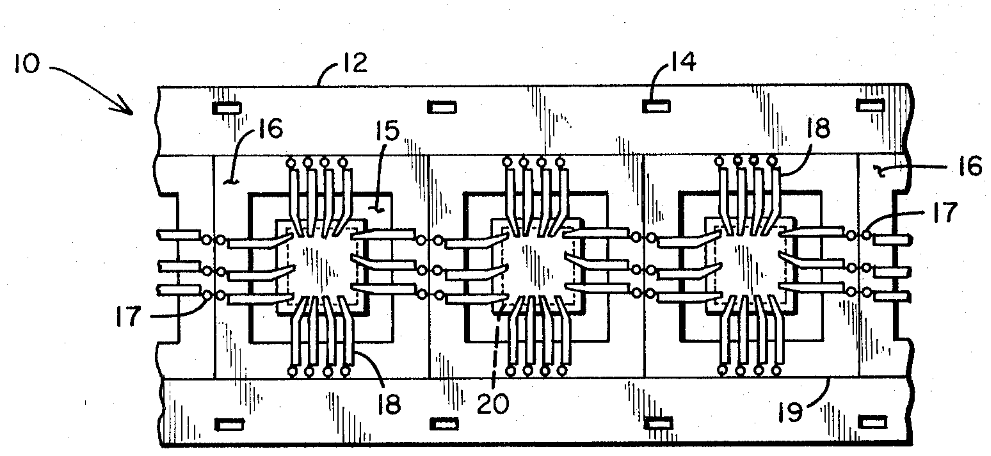
FIG. 2 is a plan view of the carrier strip of FIG. 1 with uncased IC chips bonded thereto.

With particular reference to FIG. 2 there is presented a plan view of the carrier strip 10 of FIG. 1 with a plurality of uncased IC chips 20 affixed thereto. Each chip 20 is bonded to the associated copper leads 18 of the associated lead frame 16 by thermocompressively bonding, by gold bumps, the inner end terminal 42 of each separate copper lead 18 to the associated terminal contact 21 on the associated chip 20. After the bonding of the chips 20 to the associated copper leads 18 each individual chip 20 may then be functionally tested using the outer end terminals of each separate copper lead 18 for electrical access to the integrated circuitry on the associated chip 20. After functionally testing the individual chips 20 on the carrier strip 10, the acceptable chips 20 and selected portions of their associated lead frames 16 are separated from the carrier strip 10.

Figure 3:
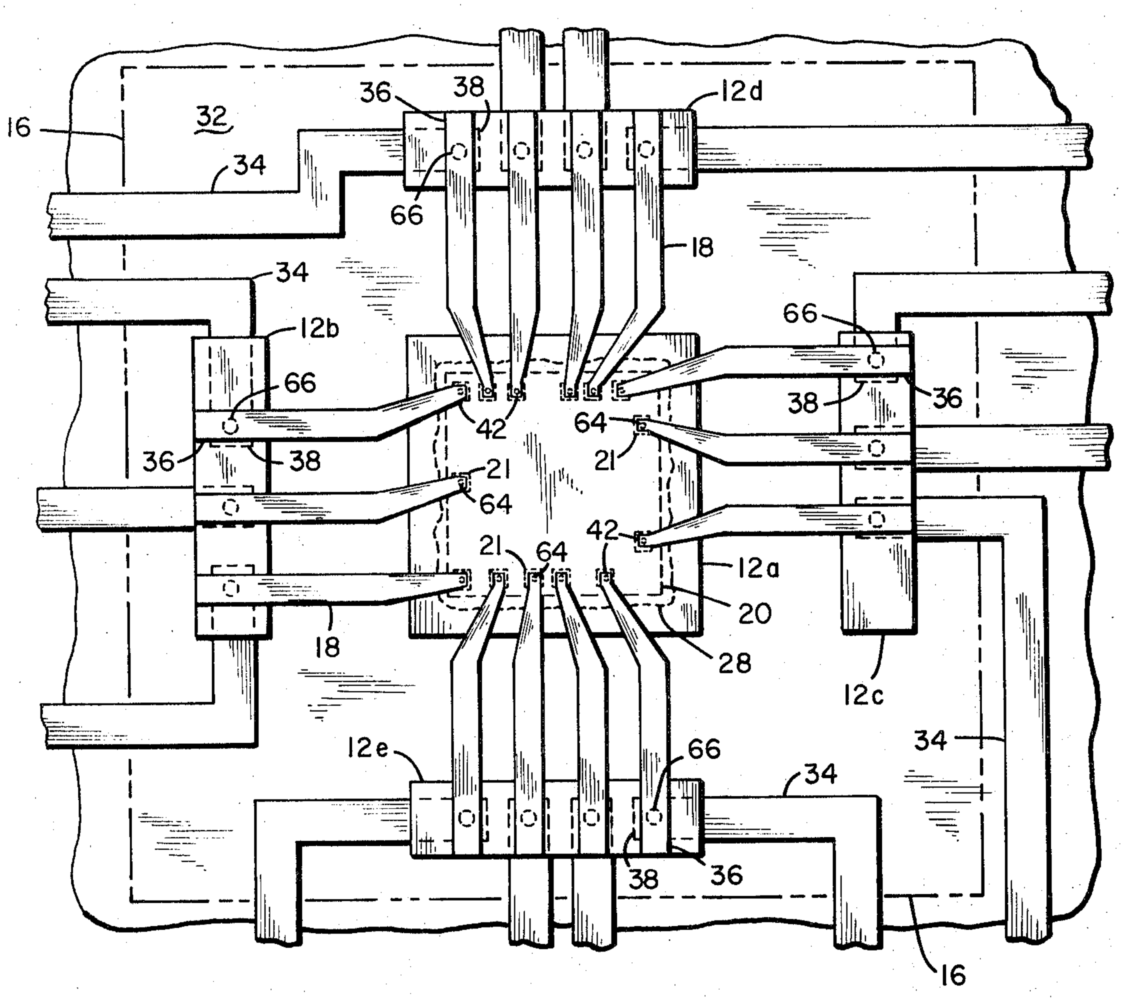
FIG. 3 is a plan view of an uncased IC chip and its associated lead frame bonded to a supporting substrate member.

With particular reference to FIG. 3 there is presented a plan view of a single lead frame 16 and chip 20 after selective separation from carrier strip 10 for forming the separate sheet members 12*a*, *b*, *c*, *d*, *e*. Chip 20 (and sheet member 12*a*) is adhesively affixed to a supporting substrate member 32 having a plurality of thick film conductive members 34 affixed to the top surface thereof. With a portion of a conductive epoxy adhesive 28 upon the top surface of substrate 32, the bottom surface of chip 20 is brought into contact therewith while the outer end terminals 36 of the groups of copper leads 18 at their associated sheet members 12*b*, *c*, *d*, *e* are oriented to match the pattern of the terminal pads 38 of the associated conductive members 34 on supporting substrate member 32. With chip 20 then bonded to the supporting substrate member 32 by the conductive epoxy adhesive the outer end terminal 36 of each lead 18 that make up the associated copper lead frame pattern are thermocompressively bonded to the corresponding terminal pads 38 of the associated conductive members 34. Thus, the inner end terminals 42 that are affixed to the surface of conductive sheet member 12*a* and the outer end terminals 36 of each group of separate leads 18 that are affixed to the associated separate sheet members 12*b*, *c*, *d*, *e* are utilized to complete the electrical coupling of the integrated circuitry on the associated chip 20 to the conductive members 34 on the supporting substrate member 32.

Figure 4:
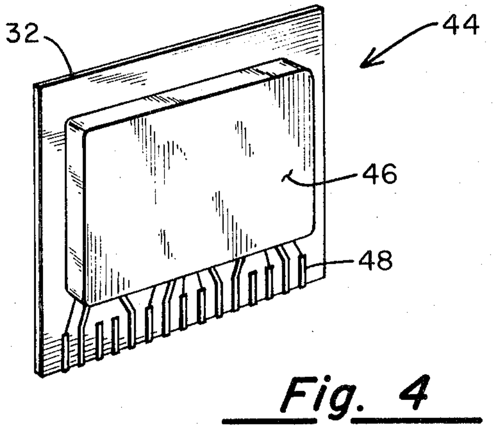
FIG. 4 is an isometric view of the combination of FIG. 3 with a hermetically sealing top.

With particular reference to FIG. 4 there is presented an isometric view of the semiconductor package 44 of the present invention. Semiconductor package 44 preferrably consists of an array of chips 20 bonded to a ceramic supporting substrate member 32 in a manner illustrated in FIG. 3 with a suitable cover 46 hermetically bonded to the top surface of supporting substrate member 32 to encase the chips 20 and their associated lead frames 16 and the circuitry 34 on supporting substrate member 32 which circuitry terminates in a plurality of conductive members 48 for edge mounting in a suitable printed circuit connector.

Figure 5:
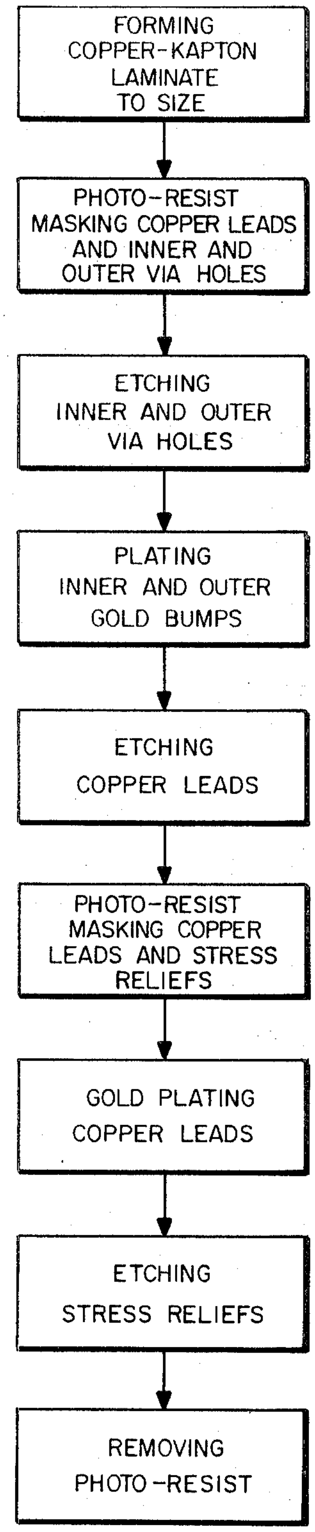
FIG. 5 forms a flow diagram illustrating a typical series of steps that may be followed in preparing a carrier strip in accordance with the present invention.
Figure 6:
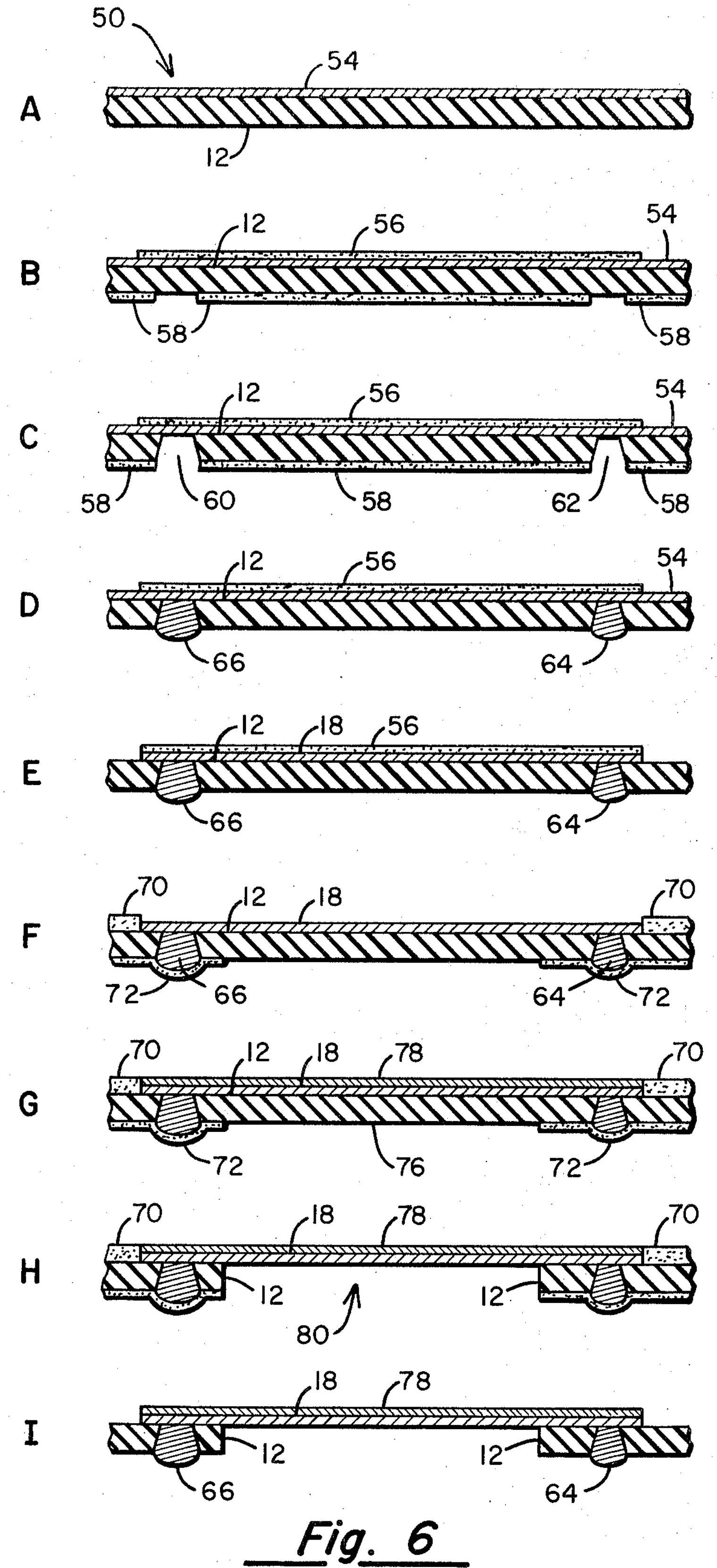
FIG. 6 forms a series of views illustrating a production carrier strip which is under preparation in accordance with the technique of FIG. 5, the various figures illustrating the carrier strip progressively in various stages of its production and corresponding to the steps that are indicated adjacently in the flow diagram of FIG. 5.

Discussion of an exemplary method of fabrication of the carrier strip 10 of FIG. 1 proposed by the present invention shall proceed with reference to FIGS. 5 and 6. FIG. 5 illustrates a flow diagram of a series of steps that may be followed in preparing the carrier strip 10 in accordance with the preferred technique of the present invention. FIG. 6 illustrates progressively the appearance of a selected portion of the carrier strip 10 of the present invention during various stages of its fabrication. Each of the illustrations of FIG. 6 is located adjacent the step during which it is formed, as seen in the flow diagram in FIG. 5.

As indicated by the flow chart of FIG. 5, a preferred method of practicing the present invention commences, in Step A, with the forming or shaping to the desired dimensions a copper-clad laminate 50 consisting of a polyimide film such as Kapton H-film 12 of 0.0005 inch thick having a copper layer 54 of ½ ounce copper deposited or electroplated thereon avoiding the use of adhesives because of the cleaning and etching problems induced thereby. Film 12 may also be formed of a 35 or 70 millimeter (mm) film base having a plurality of sprocket holes 14 formed therein or, alternatively, a 4 inch by 6 inch Kapton sheet in which a matrix array of lead frames 16 could be formed. After shaping the laminate 50 to the desired dimensions, laminate 50 is then cleaned by any suitable commercial solvent prior to the addition, on the exposed surfaces of copper layer 54 and Kapton film 12, of the photo-resist in Step B below.

After forming laminate 50 to the desired rough dimensions in Step A, Step B of the present method is initiated. Step B consists of forming or fabricating the desired (copper) lead frame patterns in copper layer 54 and the inner and outer via hole patterns in Kapton film 12. The lead frame patterns may be formed in accordance with methods well known in the printed circuit art today such as that of the Huie, et al., U.S. Pat. No. 3,626,586. In their procedure photo-resist masks are used to form the photo-resist layers 56 and 58 whereby the uncoated areas of the copper layer 54 are to be etched away to form the desired copper lead frame pattern and the uncoated areas of the Kapton film 12 are etched away to form the desired inner and outer via hole patterns.

After forming the desired photo-resist layers 56 and 58 on copper layer 54 and Kapton film 12 in Step B above, Step C of the present invention is initiated. Step C consists of forming the desired inner and outer via holes 60 and 62, respectively, in the Kapton film 12 as determined by the photo-resist layer 58 of Step B above. The etching of the inner and outer via holes 60 and 62 in Kapton film 12 may be performed by any well-known method including immersing the photo-resist mask laminate 50 in a 40 percent sodium hydroxide (NaOH) bath at 58° – 60° C for a sufficient period to etch the desired amount of the Kapton film 12 to expose the underside of the copper layer 54 which will form the interconnect or individual lead 18 between an associated pair of inner and outer via holes 60 and 62. After the completion of the etching of the inner and outer via hole patterns in Kapton film 12 the photo-resist layer 58 is removed from the Kapton film 12 exposing all of the Kapton film 12 and the underside of the copper layer 54 in the area of the inner and outer via holes 60 and 62.

After forming the inner and outer via hole patterns in the Kapton film 12 in Step C above, Step D of the present invention is initiated. Step D consists of plating the desired inner and outer gold bumps in the inner and outer via holes 60 and 62 upon the exposed underside surfaces of copper layer 54. This gold plating step may be performed by any well-known method including that of immersing the laminate 50 in a Sel Rex Puragold 401 plating bath at 58° – 60° C for a sufficient period to form the inner and outer gold bumps 64 and 66 of a sufficient depth to extend through Kapton film 12 beyond the exposed bottom surface thereof approximately 0.001 inch.

After plating the inner and outer gold bumps 64 and 66 in Step D above, Step E of the present invention is initiated. Step E consists of etching the desired copper lead patterns in copper layer 54 as determined by the photo-resist layer 56 of Step B above. This etching step may be performed by any wellknown method including that of the Huie, et al., U.S. Pat. No. 3,626,586. After the pattern's copper leads 18 have been chemically etched in copper layer 54 the photo-resist layer 56 is removed preparatory to the photo-resist masking step of Step F below.

After the copper leads 18 interconnecting the inner and outer gold bumps 64 and 66 have been formed in Step E above, Step F of the present invention is initiated. Step F consists of photo-resist masking desired pattern defining photo-resist layers 70 and 72 on the top and bottom surfaces of the laminate of Step E above; on the top surface of Kapton film 12 forming the photo-resist mask 70 exposing the interconnect 18 for the subsequent gold plating thereof, and the photo-resist mask 72 on the bottom surface, including the exposed surfaces of gold bumps 64 and 66, for defining the stress reliefs that will be etched from Kapton film 12 as in area 76.

After photo-resist masking the desired photo-resist patterns formed by photo-resist layers 70 and 72 on the top and bottom surfaces of Kapton film 12 in Step F, Step G of the present invention is initiated. Step G consists of gold plating the exposed surfaces of the copper leads or interconnects 18 formed in Step E above with a gold layer 78 for the oxidation and corrosion proofing thereof. This gold plating step may be similar to that of Step D above.

After gold plating the copper leads 18 or interconnects in Step G, Step H of the present method is initiated. Step H consists of etching stress reliefs 80 in Kapton film 12 in the exposed area 76 of photo-resist layer 72. This etching step may be similar to that of Step D above.

After gold plating the copper leads 18 in Step G and etching the stress reliefs in Kapton film 12 in area 76 in Step H, Step I of the present method is initiated. Step I consists of removing the photo-resist masking layers 70 and 72 from the top and bottom surfaces of the product of Step H. This step is the last step of the present method and provides as its product the flexible carrier 10 illustrated in FIG. 1.

Figure 7:
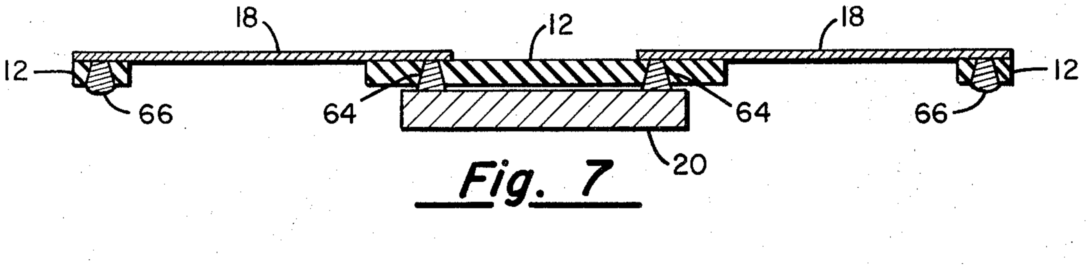
FIG. 7 is a diagrammatic illustration of an uncased IC chip thermocompressively bonded to the inner gold bumps of the associated lead frame.

After completion of the flexible carrier 10 as illustrated in FIG. 1 in accordance with the method of FIGS. 5 and 6, the carrier 10 is prepared for being thermocompressively or ultra-sonically bonded to the uncased IC chips 20. Initially, the copper links interconnecting the copper leads 18 (used during the forming of such copper leads 18) are punched out, as at points 17 of FIG. 2, so as to isolate each copper lead 18 from all other copper leads 18 on carrier 10. Next, the associated chip 20 is secured under the tip of a bonding tool, such as by vacuum pressure, with the pattern of terminal contacts on the chip 20 oriented in a superposed manner above the pattern of the inner gold bumps 64 on the carrier 10. Ultrasonic energy is applied to the heated tip of the thermocompressive bonding tool creating sufficient motion to effect bonding of the inner gold bumps 64 on end terminals 42 to their associated terminal contacts 21 on chip 20. Next, using the copper leads 18 for electrical access to the integrated circuitry on the chip 20, chip 20 is functionally tested for acceptability. After functionally testing the individual chips 20 along the carrier 10, the acceptable chips 20 and the selected portions 12*a*, *b*, *c*, *d*, *e* of sheet member 12 of their associated lead frames 16 are separated from the carrier 10 in preparation for their bonding to a suitable substrate member. With particular reference to FIG. 7 there is presented a diagrammatic illustration of a chip 20 bonded to the carrier 10.

Figure 8:
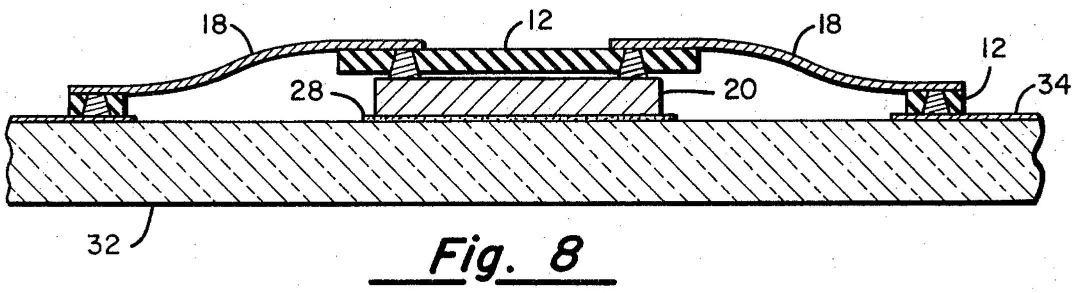
FIG. 8 is a diagrammatic illustration of the product of FIG. 7 thermocompressively bonded to the supporting substrate member by the outer gold bumps of the associated lead frame.

An acceptable chip 20 and its associated lead frame 16 are held by a suitable thermocompression wobble bonding tool with the pattern of outer gold bumps 66 on the outer end terminals 36 of copper leads 18 oriented in s superimposed manner above the mating pattern of aluminum pads 38 on a substrate member 32 see FIG. 3; an epoxy adhesive is utilized to adhesively affix chip 20 to the substrate member 32 while the bonding tool is bonding the outer gold bumps 66 on the leads 18 to the terminal pads 38 on the substrate member 32. The stress reliefs formed by separating portions 12*a*, *b*, *c*, *d*, *e* from each other prevent any stress induced by the bonding of the outer gold bumps 66 to the terminal pads 38 from affecting the bonding of the inner gold bumps 64 to the terminal contacts 21. This will provide a product diagrammatically illustrated in FIG. 8. Lastly, a suitable cover 48 such as illustrated in FIG. 4 is then hermetically bonded to the substrate member 32 to encase the chips 20 and their associated lead frames 16 and the associated circuitry 34 on the supporting substrate 32 as illustrated in FIG. 4.

What is claimed is:

1. An electrically conductive lead frame for electrical coupling to a circuit device that has a predetermined pattern of terminal contacts arranged on one surface thereof, comprising:

a first flexible insulative sheet member having through its first and second surfaces a plurality of inner gold bumps arranged in a first predetermined pattern that corresponds to the predetermined pattern of terminal contacts on a circuit device and that extend through said first sheet member beyond the first surface of said first sheet member;

a plurality of separate flexible insulative sheet members, each having first and second surfaces;

a plurality of groups of electrically conductive printed circuit leads, the leads of each group affixed to the second surface of said first sheet member and electrically bonded to a separate associated one of said inner gold bumps and affixed to the second surface of a separate associated one of said plurality of separate flexible insulative sheet members.

2. The lead frame of claim 1 further including a plurality of outer gold bumps through the first and second surfaces of said plurality of separate sheet members and extending beyond their first surfaces, each of said plurality of outer gold bumps electrically bonded to a separate associated one of said leads for making a continuous electrical circuit through each of said leads and its associated inner and outer gold bumps.

3. An electrically conductive lead frame, comprising:

an uncased integrated circuit chip that has a predetermined pattern of terminal contacts arranged on one surface thereof;

a first flexible insulative sheet member having through its first and second surfaces a plurality of inner gold bumps arranged in a first predetermined pattern that corresponds to the predetermined pattern of terminal contacts on said chip and that extend through said first sheet member beyond its first surface for making electrical bonded contact with the corresponding terminal contacts on said one surface of said chip;

a second flexible insulative sheet member, separated from said first sheet member, having first and second surfaces and extending around said first sheet member;

a plurality of electrically conductive printed circuit leads affixed to the second surfaces of said first and second sheet members, each conductive lead separately conductively coupled to one of said inner gold bumps and unsupportively extending from said first sheet member to said second sheet member.

4. The lead frame of claim 3 further including a plurality of outer gold bumps through the first and second surfaces of said second sheet member and extending beyond its first surface, each of said plurality of outer gold bumps electrically bonded to a separate associated one of said leads for making a continuous electrical circuit through each of said leads and its associated inner and outer gold bumps.

5. An electrically conductive lead frame for an uncased integrated circuit chip that has a predetermined pattern of terminal contacts arranged on one surface thereof, comprising:

a flexible insulative sheet member having through its first and second surfaces a plurality of inner via holes in a first predetermined pattern that corresponds to the predetermined pattern of terminal contacts on a uncased integrated circuit chip to which said lead frame is to be subsequently bonded;

a plurality of inner gold bumps, one in each of said plurality of inner via holes, extending through said sheet member beyond the first surface of said sheet member;

a plurality of outer via holes in said sheet member in a second predetermined pattern that is outside of said first predetermined pattern of inner via holes, which second predetermined pattern corresponds to the predetermined pattern of terminal tabs on a substrate member to which said lead frame is to be subsequently bonded;

a plurality of outer gold bumps, one in each of said plurality of outer via holes, extending through said sheet member beyond said first surface of said sheet member;

a plurality of electrically conductive leads affixed to the second surface of said sheet member, each of said plurality of conductive leads separately conductively bonded to one of said inner gold bumps and to one of said outer gold bumps;

said sheet member comprised of first and second separated portions formed by removing a portion of said sheet member from between said first predetermined pattern of inner gold bumps and second predetermined pattern of outer gold bumps;

said first separated portion of said sheet member supporting said plurality of inner via holes in said first predetermined pattern;

said second separated portion of said sheet member supporting said plurality of outer via holes in said second predetermined pattern; and, said plurality of conductive leads unsupportively extending from said first separated portion to said second separated portion.

6. An electrically conductive lead frame for electrical coupling to a circuit device that has a predetermined pattern of terminal contacts arranged on one surface thereof, comprising:

a first flexible insulative sheet member having through its first and second surfaces a plurality of inner gold bumps arranged in a first predetermined pattern that corresponds to the predetermined pattern of terminal contacts on a circuit device and that extend through said first sheet member beyond the first surface of said first sheet member;

a second flexible insulative sheet member, separate from said first flexible insulative sheet member, having through its first and second surfaces a plurality of outer gold bumps arranged in a second predetermined pattern that corresponds to the predetermined pattern of terminal tabs on a substrate member to which said lead frame and said circuit device are to be subsequently bonded;

a plurality of electrically conductive printed circuit leads affixed to the second surfaces of said first and second sheet members, each lead separately conductively coupled to one of said inner gold bumps and one of said outer gold bumps and unsupportively extending from said first sheet member to said second sheet member.

* * * * *